United States Patent [19]

Tsukamoto

[11] Patent Number: 5,685,304
[45] Date of Patent: Nov. 11, 1997

[54] DIFFUSION SENSITIZING IMAGING METHOD AND MRI APPARATUS

[75] Inventor: Tetsuji Tsukamoto, Tokyo, Japan

[73] Assignee: GE Yokogawa Medical Systems, Limited, Tokyo, Japan

[21] Appl. No.: 494,126

[22] Filed: Jun. 23, 1995

[30] Foreign Application Priority Data

Jun. 28, 1994 [JP] Japan .................................. 6-146044

[51] Int. Cl.$^6$ ................................................ A61B 5/055
[52] U.S. Cl. ...................... 128/653.2; 324/307; 324/309
[58] Field of Search ...................... 128/653.2; 324/307, 324/309

[56] References Cited

U.S. PATENT DOCUMENTS

| | | | |
|---|---|---|---|
| 4,970,457 | 11/1990 | Kaufman et al. | 324/309 |
| 5,270,654 | 12/1993 | Feinberg et al. | 324/309 |
| 5,291,138 | 3/1994 | Macovski | 324/309 |
| 5,311,132 | 5/1994 | Noll et al. | 324/309 |
| 5,327,088 | 7/1994 | Pipe | 324/309 |
| 5,402,785 | 4/1995 | Leigh et al. | 128/653.2 |
| 5,406,947 | 4/1995 | Kimura | 128/653.2 |
| 5,485,086 | 1/1996 | Meyer et al. | 324/307 |

OTHER PUBLICATIONS

Dennis Le Bihan; Jour. Mag. Reson 86, pp. 445–452, 1990.
Ahn, IEEE Trans. on Med. Imag. vol. MI–5, No. 1, Mar. 1986, pp. 2–7.

*Primary Examiner*—Brian L. Casler
*Attorney, Agent, or Firm*—Moonray Kojima

[57] ABSTRACT

A diffusion sensitizing imaging method and MRI apparatus capable of reducing image pickup time and thereby suppress artifacts attributable to body movement, wherein an RF pulse of 90° is applied to a diagnostic portion so that spins are created therein; and an RF pulse of 180° is applied on expiration of a time length TE/2 so as to reverse the spins; an echo is imaged; and the image after an echo center is sampled; and the RRF pulse application is such that the gradients of the read out axis and the warp axis form a spiral trajectory which extends in a spiral form from the center to the end of the k-space; and wherein before and after application of the 180° RF pulse, strong motion probing gradients, for diffusion sensitization, are applied to an arbitrary gradient axis; and wherein the phase of the MR data is modified based on the phase of the MR data at the center of the k-space, or based on the average phase of the MR data at the center of the k-space.

6 Claims, 6 Drawing Sheets

DIFFUSION SENSITIZING IMAGING METHOD AND MRI APPARATUS

BACKGROUND OF THE INVENTION

1. Field of the Invention

The present invention relates to a diffusion sensitizing imaging method and an MRI (Magnetic Resonance Imaging) apparatus, and more particularly to a diffusion sensitizing imaging method and an MRI apparatus for producing a stable diffusion sensitized image by alleviating artifacts attributable to the motion and breathing of the patient under test.

2. Description of the Related Art

FIG. 6 is a flowchart of an example of the diffusion sensitizing imaging process based on the conventional MRI apparatus.

In step B1, the operator sets the portion to be diagnosed and the number of times N of phase encoding.

In step B2, a pulse sequence based on the spin-echo scheme, with the IVIM (Intra-Voxel Incoherent Motion) scheme being applied thereto, is created for the diagnostic portion specified by the operator.

FIG. 7 shows an example of the pulse sequence based on the spin-echo scheme with the application of the IVIM scheme.

In this pulse sequence, an RF pulse R90 of 90° is applied to the diagnostic portion so that spins are created in it, an RF pulse R180 of 180° is applied on expiration of time length TE/2 so as to reverse the spins, an echo is imaged, and the image is sampled. Before and after the application of the RF pulse R180, strong MP (Motion Probing) gradients G1 and G2 for diffusion sensitization are applied to an arbitrary gradient axis. The S1 and S2 are slice selection gradients, RD is the readout gradient, PH is the phase encoding gradient, and TE is the echo time.

The pulse sequence based on the spin-echo scheme with the application of the IVIM scheme is disclosed in Japanese patent Laid-Open No. Hei6-121781, for example.

Returning to FIG. 6, in step B3, the above-mentioned pulse sequence is repeated for the number of times n of phase encoding, while varying the phase encoding gradient PH, so as to obtain sequentially row data (will be termed "MR (Magnetic Resonance) data" hereinafter) including NMR (Nuclear Magnetic Resonance) information along lines L1, ..., Ln on the k-space S, as shown in FIG. 8.

In step V10, two-dimensional Fourier transformation is conducted for the MR data on the k-space S, and a diffusion sensitized image of the diagnostic portion is formed.

In step V11, the resulting diffusion sensitized image is displayed.

The foregoing conventional diffusion sensitizing imaging method necessitates the repetition of the above-mentioned pulse sequence (FIG. 7) for the number of times n of phase encoding. The number of times n of phase encoding adopted frequently is a value between 128 and 256, and in this case image pickup takes a time of 2 to 4 minutes.

However, the image pickup time of 2~4 minutes is too long, and artifacts attributable to the patient's body movement (e.g., breathing) are liable to emerge. The number of times n of phase encoding is directly related to the resolution of the k-space S in its ky direction (FIG. 7), and therefore if this value is reduced to shorten the image pickup time, the resulting resolution will not match with the resolution in the kx direction of the k-space S (determined from the sampling frequency) and a new problem of degraded picture quality will emerge.

SUMMARY OF THE INVENTION

Accordingly, it is an object of the present invention to provide a diffusion sensitizing imaging method and an MRI apparatus capable of reducing the image pickup time without deteriorating the picture quality, thereby suppressing the artifacts attributable to the patient's body movement.

At a first viewpoint, the present invention resides in a diffusion sensitizing imaging method for producing a diffusion sensitized image by collecting MR data including diffusion information by use of a pulse sequence with the IVIM scheme applied thereto, wherein MR data at the center of the k-space is collected for the section of the approximate echo center and MR data is collected sequentially along spiral trajectories which extend in a spiral form from the center to the end of the k-space for the section after the approximate echo center.

At a second viewpoint, the present invention resides in a diffusion sensitizing imaging method for producing a diffusion sensitized image by collecting MR data including diffusion information by use of a pulse sequence with the IVIM scheme applied thereto, wherein MR data at the center of the k-space is collected for the section of the approximate echo center and MR data is collected sequentially along spiral trajectories which extend in a spiral form from the center to the end of the k-space for the section after the approximate echo center, and the phase of the MR data is modified based on the phase of the MR data at the center of the k-space or the average phase of the MR data about the center of the k-space.

At a third viewpoint, the present invention resides in a diffusion sensitizing imaging apparatus for producing a diffusion sensitized image by collecting MR data including diffusion information by use of a pulse sequence with the IVIM scheme applied thereto, wherein the apparatus includes spiral scanning means for collecting MR data at the center of the k-space for the section of the approximate echo center and collecting MR data sequentially along spiral trajectories which extend in a spiral form from the center to the end of the k-space for the section after the approximate echo center.

At a fourth viewpoint, the present invention resides in a diffusion sensitizing imaging apparatus for producing a diffusion sensitized image by collecting MR data including diffusion information by use of a pulse sequence with the IVIM scheme applied thereto, wherein the apparatus includes spiral scanning means for collecting MR data at the center of the k-space for the section of the approximate echo center and collecting MR data sequentially along spiral trajectories which extend in a spiral form from the center to the end of the k-space for the section after the approximate echo center, and phase modification means for modifying the phase of the MR data based on the phase of the MR data at the center of the k-space or the average phase of the MR data about the center of the k-space.

In the diffusion sensitizing imaging method of the first viewpoint and the diffusion sensitizing imaging apparatus of the third viewpoint, MR data including diffusion information is collected by use of a pulse sequence with the IVIM scheme applied thereto, and in this case MR data at the center of the k-space is collected for the section of the approximate echo center and MR data is collected sequentially along spiral trajectories which extend in a spiral form from the center to the end of the k-space for the section after the approximate echo center.

Based on MR data collection along spiral trajectories in k-space, it is possible to increase the number of times of samplings for each pulse sequence to 4 to 16 times the conventional method and apparatus. Accordingly, it is possible to reduce the number of times each pulse sequence is supplied, i.e., the number of times n of the repetition of pulse sequence, to ¼ to 1/16 time the conventional method and apparatus. For example, the conventional number of phase encodings, such as in the range of 128~256 can be reduced to the range of 8~64 according to this invention. As a result, a conventional image pickup time in the range of 2~4 minutes, for example, can be reduced to an image pickup time in the range of 7.5 seconds to 1 minute according to this invention, and consequently motion artifacts can be suppressed. Because of the isotropic distribution of positions of MR data on the k-space, the picture quality is not deteriorated.

In the diffusion sensitizing imaging method of the second viewpoint and the diffusion sensitizing imaging apparatus of the fourth viewpoint, MR data including diffusion information is collected by use of a pulse sequence with the IVIM scheme applied thereto, and in this case MR data at the center of the k-space is collected for the section of the approximate echo center and MR data is collected sequentially along spiral trajectories which extend in a spiral form from the center to the end of the k-space for the section after the approximate echo center. Subsequently, the phase of the MR data is modified based on the phase of the MR data at the center of the k-space or the average phase of the MR data about the center of the k-space.

Although collection of MR data along spiral trajectories on the k-space alleviates motion artifacts as mentioned above, some inevitable artifacts appear as a phase shift in MR data. The influence of body movement can further be reduced by modifying the MR data such that the phase of MR data is consistent at the center of k-space where the phase should be common among individual pulse sequences.

It is desirable to use the phase of MR data at the center of the k-space in case the s/n ratio is good, or use the average phase of MR data about the center of the k-space in case the s/n ratio is not good.

The present invention will be explained in more detail for an illustrated embodiment, although this invention is not confined to this embodiment.

DETAILED DESCRIPTION OF THE PREFERRED EMBODIMENT

Figure 1:
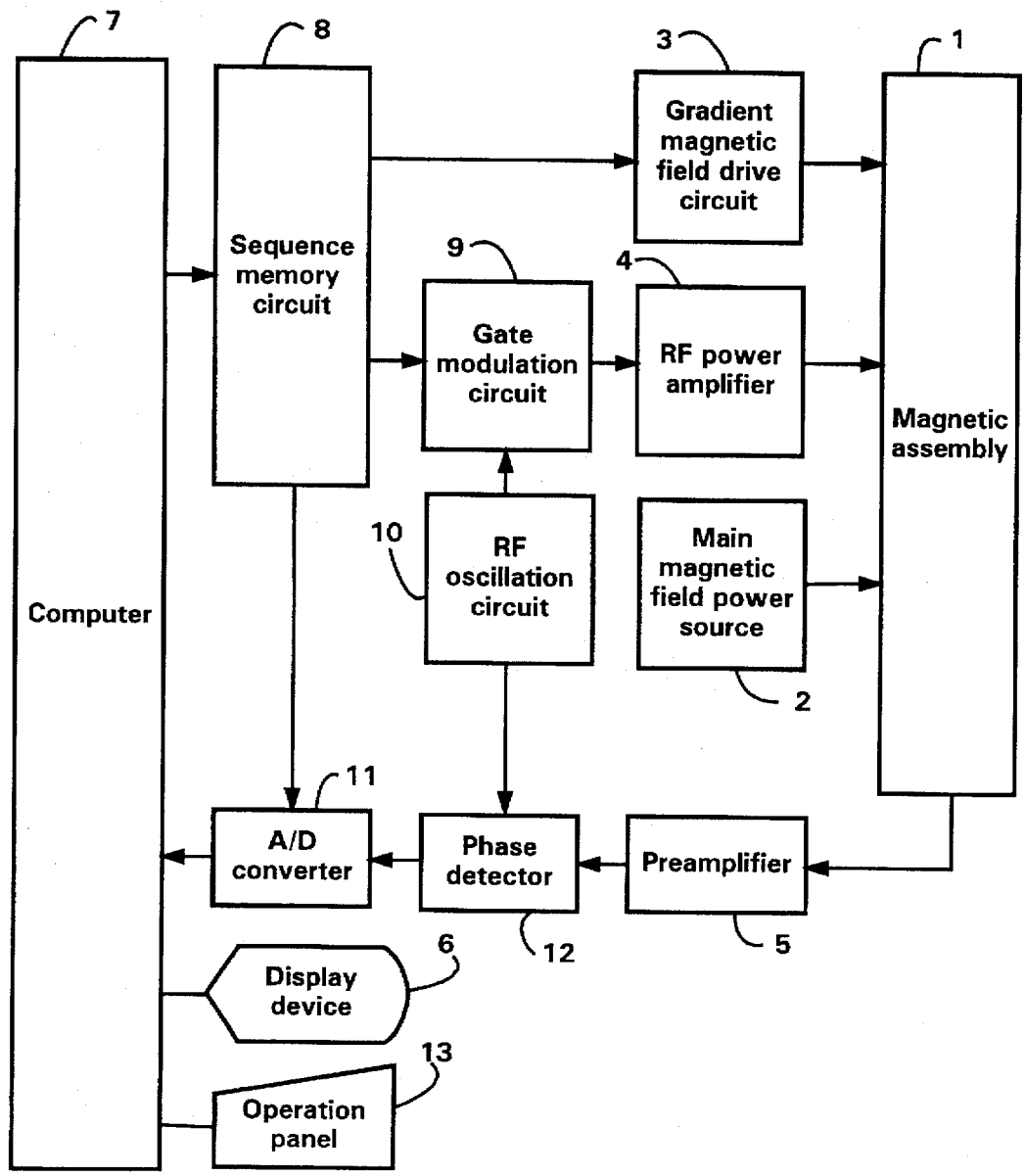
FIG. 1 is a block diagram of the MRI apparatus based on an embodiment of this invention.

FIG. 1 is a block diagram of the MRI apparatus based on the embodiment of this invention.

In the MRI apparatus 100, the magnet assembly 1 includes a bore section (hole) for inserting a specimen into the interior. Disposed to surround the bore section are a static magnetic field coil which applies a constant static magnetic field to the specimen, gradient magnetic field coils which produce gradient magnetic fields (the gradient magnetic field coils include coils on the slice axis, frequency axis and phase axis), a transmission coil which produces an RF pulse for inducing spins of atomic nucleus in the specimen, and a reception coil which detects the NMR signal from the specimen. The static magnetic field coil, gradient magnetic field coils, transmission coil and reception coil are connected to the main magnetic field power source 2, gradient magnetic field drive circuit 3, RF power amplifier 4 and pre-amplifier 5, respectively.

The sequence memory circuit 8 operates in accordance with the commands from the computer 7 to operate the gradient magnetic field drive circuit 3 in accordance with the memorized pulse sequence so that the gradient magnetic field coils in the magnet assembly 1 produce the gradient magnetic fields, operate the gate modulation circuit 9 to modulate high-frequency output signal of the RF oscillation circuit 10 into a pulsed signal having a prescribed timing and prescribed envelope, conduct the resulting RF pulse to the RF power amplifier 4, and apply the amplified pulse to the transmission coil of the magnet assembly 1 so as to transmit the RF pulse.

The pre-amplifier 5 amplifies the NMR signal from the specimen detected by the reception coil of the magnet assembly 1 and delivers the output to the phase detector 12. The phase detector 12, which receives the output of the RF oscillation circuit 10 as a reference signal, implements the phase detection for the NMR signal from the pre-amplifier 5 and delivers the result to the A/D converter 11. The A/D converter 11 converts the analog phase-detected signal into a digital signal and delivers it to the computer 7.

The computer 7 implements the image reforming process for the digital signal provided by the A/D converter 11 thereby to create an object image (a proton density image of the object portion). The object image is displayed on the display device 6.

The computer 7 implements the overall control inclusive of the reception of information entered on the operation panel 13.

The spiral scanning means and phase modification means pertinent to this invention are accomplished as functions of the MRI apparatus 100.

That is to say, the computer 7 applies suitable control to direct the sequence memory 8 to apply suitable signals to drive gradient magnetic field drive circuit 3, gate modulation circuit 9, and RF power amplifier 4, so that appropriate magnetic signals are supplied to the magnetic assembly, to cause signals which result in the desired k-space spiral trajectories, which are then collected by the reception coils and detected by preamplifier 5, phase detector 12, and A/D converter 11, and then supplied to computer 7 for processing of the k-space spiral trajectories.

Figure 2:
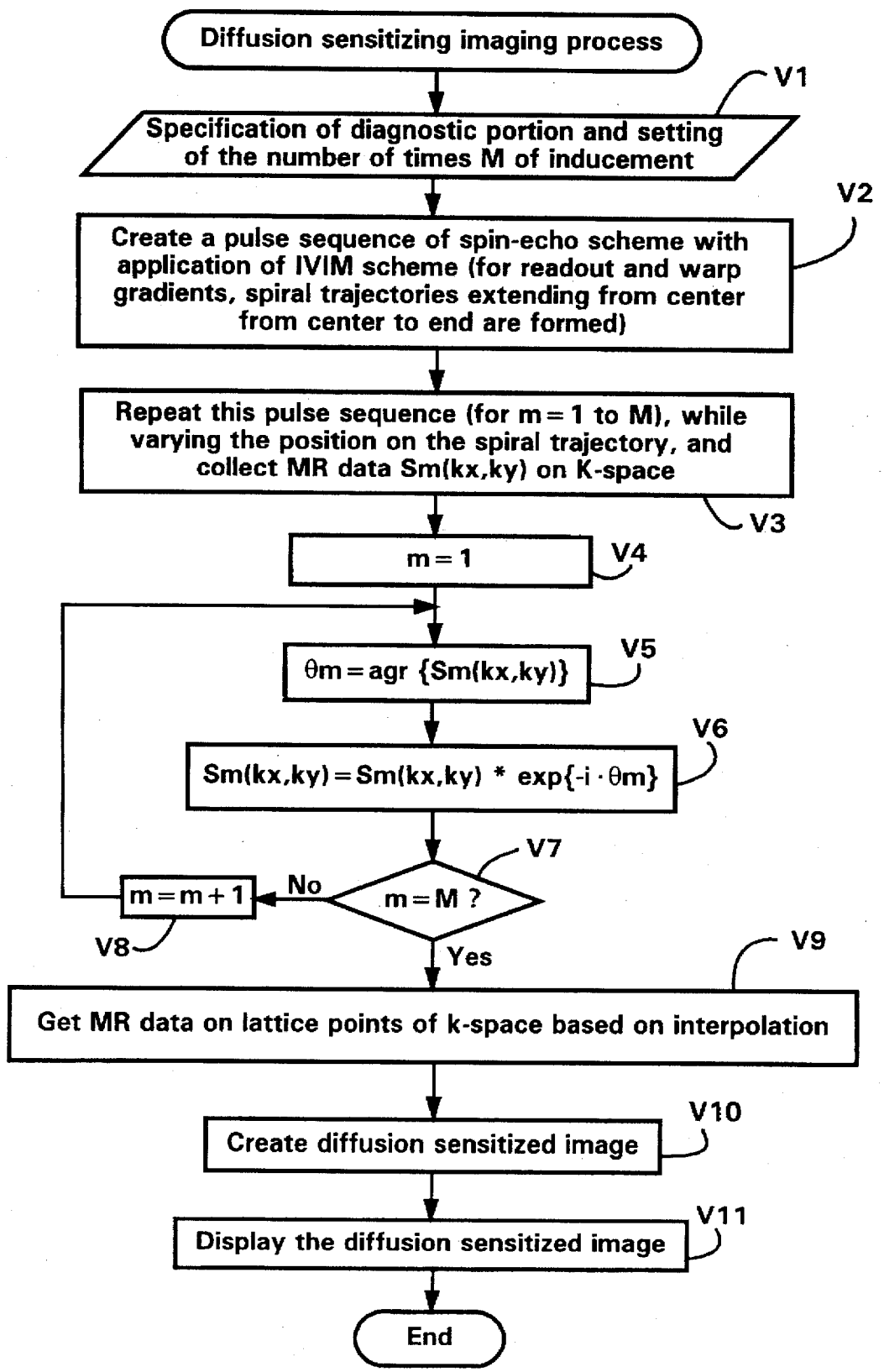
FIG. 2 is a flowchart of the diffusion sensitizing imaging process of the MRI apparatus shown in FIG. 1.

FIG. 2 is a flowchart of the diffusion sensitizing imaging process based on this invention.

In step V1, the operator sets the portion to be diagnosed and the number of times M of inducement.

In step V2, a pulse sequence based on the spin-echo scheme, with the IVIM being applied thereto, is created for the diagnostic portion specified by the operator. For the readout gradient and warp gradient, it is assumed that a spiral trajectory that extends in a spiral form from the center to the end of the k-space is formed.

Figure 3:
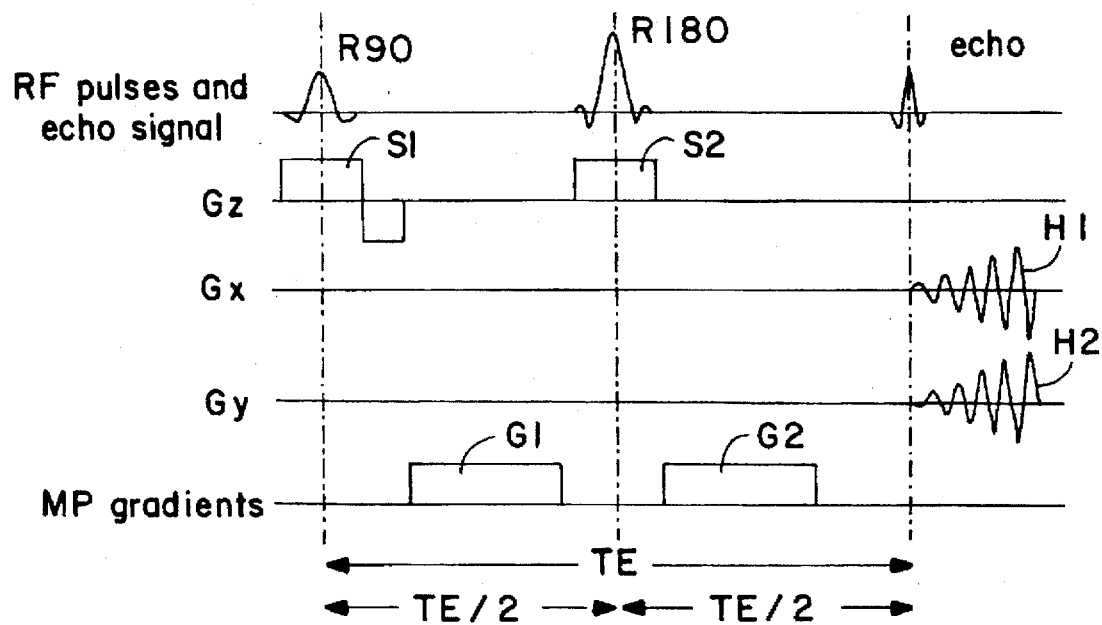
FIG. 3 is a diagram illustrating the pulse sequence used in the diffusion sensitizing imaging method of this invention.

FIG. 3 shows an example of the pulse sequence based on the spin-echo scheme with the application of the IVIM scheme.

Figure 4:
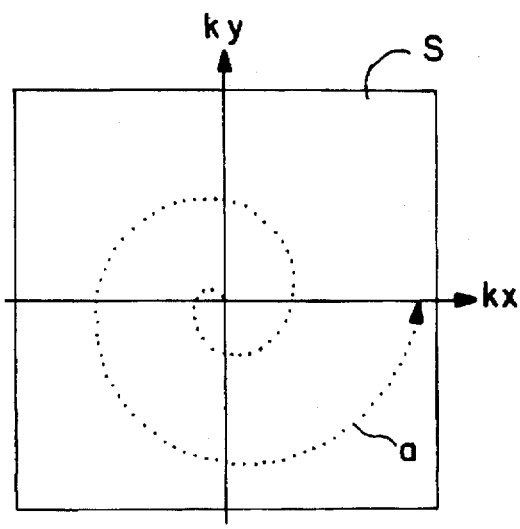
FIG. 4 is a conceptual diagram of a spiral trajectory which corresponds to the pulse sequence shown in FIG. 3.

In this pulse sequence, an RF pulse R90 of 90° is applied to the diagnostic portion so that spins are created in it, an RF pulse R180 of 180° is applied on expiration of time length TE/2 so as to reverse the spins, an echo is imaged, and the image after the echo center is sampled. In this case, RF pulse application is such that the gradients H1 and H2 of the readout axis Gx and warp axis Gy form a spiral trajectory Éø that extends in a spiral form from the center to the end of the k-space S as shown in FIG. 4. Before and after the application of the RF pulse R180, strong MP gradients G1 and G2 for diffusion sensitization are applied to an arbitrary gradient axis. The S1 and S2 on the slice axis Gz are slice selection gradients.

Figure 5:
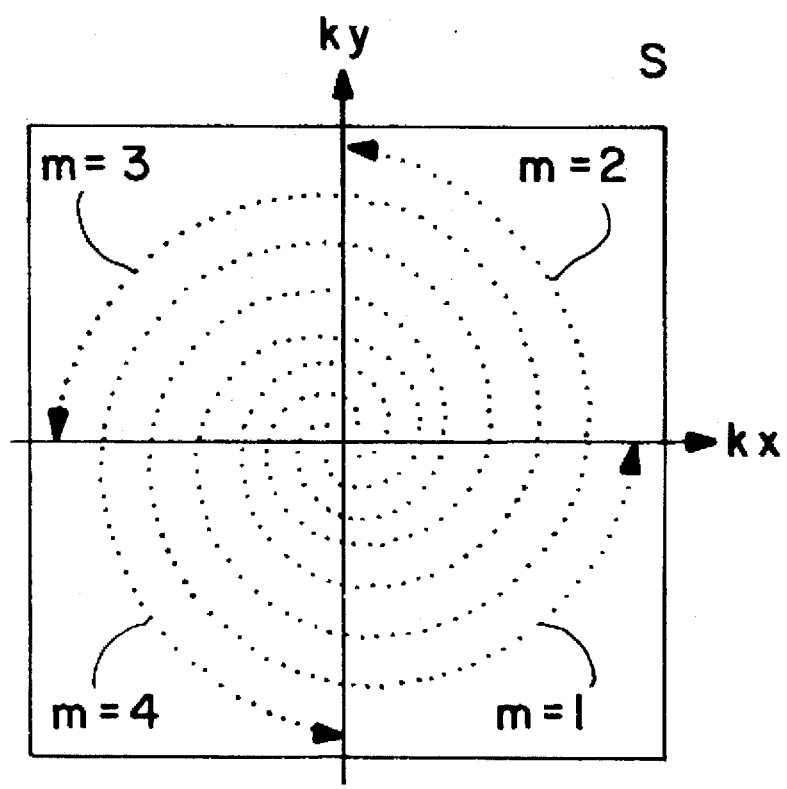
FIG. 5 is a conceptual diagram of spiral trajectories obtained by a number of times of inducement of the pulse sequence shown in FIG. 3.
Figure 6:
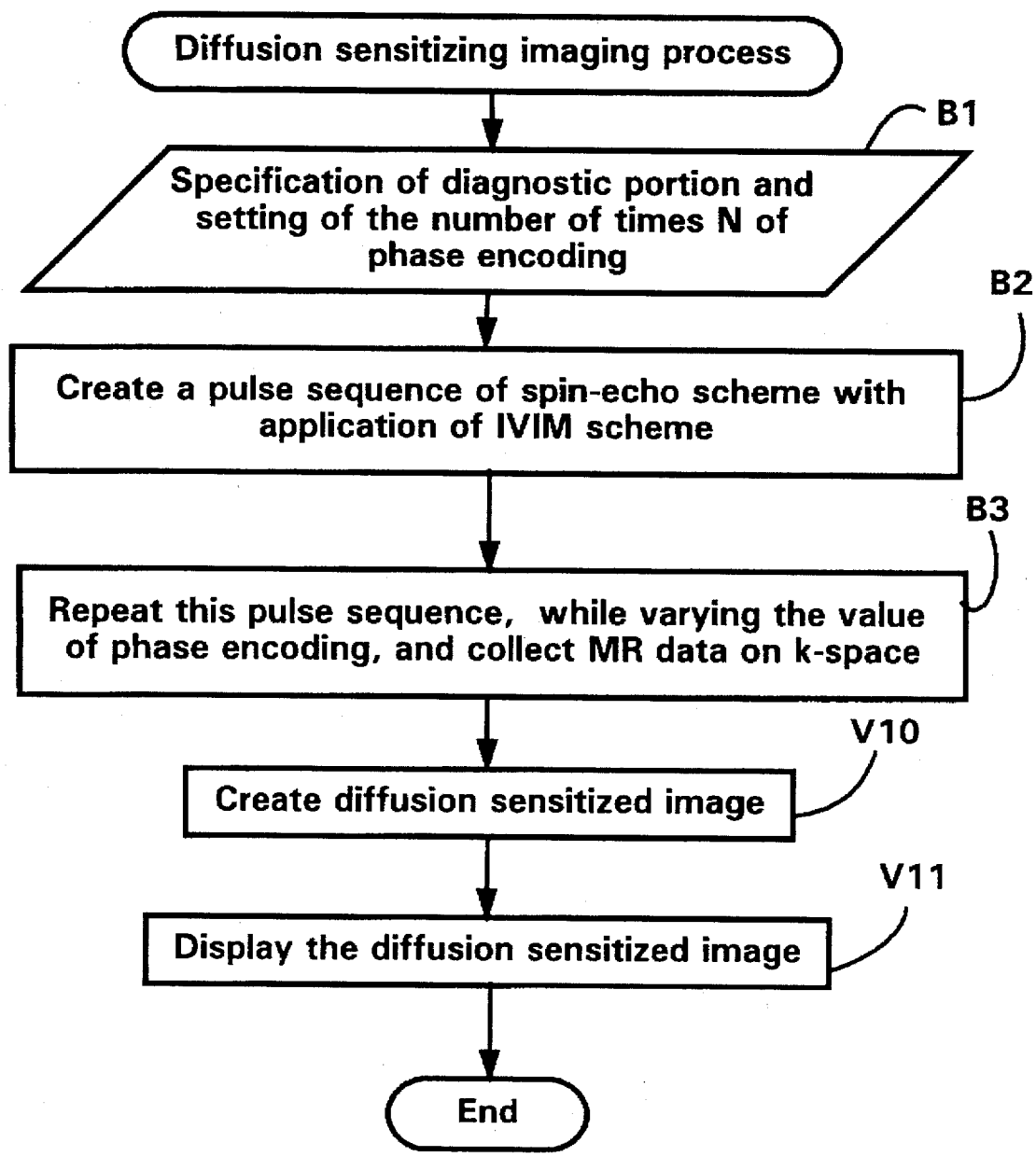
FIG. 6 is a flowchart of the diffusion sensitizing imaging process of the conventional MRI apparatus.
Figure 7:
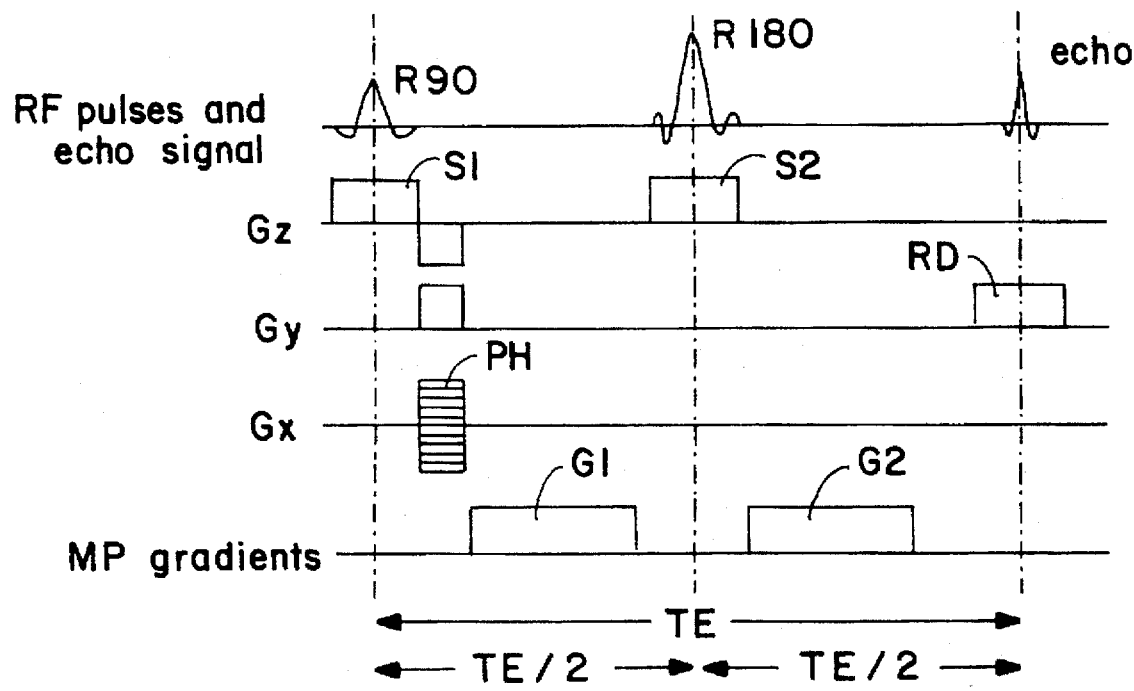
FIG. 7 is a diagram illustrating the pulse sequence used in the conventional diffusion sensitizing imaging method.
Figure 8:
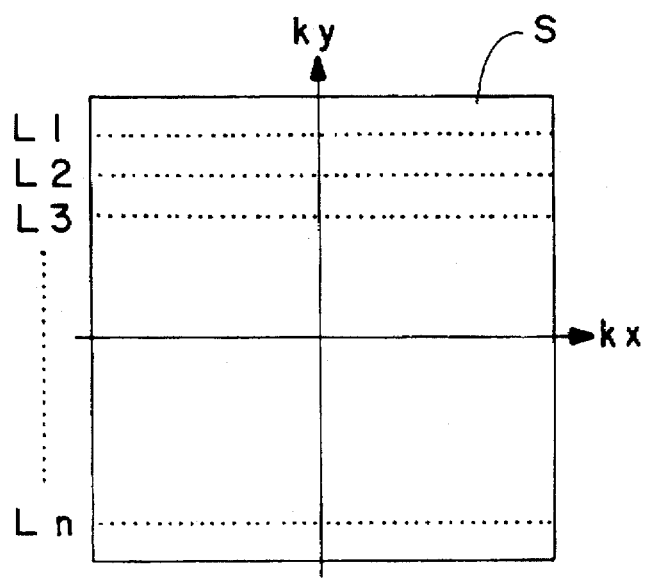
FIG. 8 is a conceptual diagram of a line trajectory which corresponds to the pulse sequence shown in FIG. 6.

Returning to FIG. 2, in step V3, the above-mentioned pulse sequence is repeated for the number of times M for inducement number m=1 to m=M, while varying the position of spiral trajectory α, and MR data $Sm(kx,ky)$ on the k-space are collected. FIG. 5 shows spiral trajectories for inducement numbers M=1, 2, 3 and 4, with M being set to 4. The MR data $Sm(kx,ky)$ are MR data at positions along the spiral trajectories with these inducement numbers m.

In step V4, the phase modification counter m is initialized to "1".

In step V5, the phase $\theta m$ of MR data $Sm(0,0)$ at the the center of the k-space is calculated based on the following formula.

$$\theta m = arg\{Sm(0,0)\}$$

In step V6, the phases of MR data $Sm(kx,ky)$ at positions along the spiral trajectories for inducement numbers m are calculated based on the following formula.

$$Sm(kx,ky)=Sm(kx,ky)*exp(-i\theta m)$$

In steps V7 and V8, the above-mentioned steps V5 and V6 are repeated for m=2 to M thereby to modify the phases of all MR data $Sm(kx,ky)$.

In step V9, MR data on the lattice points on the k-space are evaluated by the interpolation of the phase-modified MR data $Sm(kx,ky)$.

In step V10, two-dimensional Fourier transformation is conducted for the MR data on the lattice points of the k-space, and a diffusion sensitized image of the diagnostic portion is created.

In step V11, the resulting diffusion sensitized image is displayed.

The following explains the basis of the phase modification of the steps V5 and V6.

For signal sources $\rho(x,y)$ at real space positions $(x,y)$, if the movement of all signal sources is expressed uniquely as $R(t)$, the MR data $Sm(kx,ky)$ is express by the following formula.

$$Sm(kx,ky) = exp(i \cdot \theta m) \iint \rho(x,y) \cdot exp(i \cdot kx \cdot x + i \cdot ky \cdot y)dxdy$$
$$kx = \gamma \int H1 dt$$
$$ky = \gamma \int H2 dt$$
$$\theta m = \gamma \left[ \int_{t=TE/2}^{TE} G2 \cdot Rm(t)dt - \int_{t=0}^{TE/2} G1 \cdot Rm(t)dt \right]$$

where γ is the magnetism rotation ratio.

The value $\theta m$ represents the phase shift in the MP gradients G1 and G2 in the case of the occurrence of body movement. In the case of G1=G2 and without body movement, $\theta m$ is zero.

At the center of the k-space, i.e., $(kx,ky)=(0,0)$, the following formula holds.

$$Sm(0,0)=exp(i \cdot \theta m) \iint \rho(x,y)dxdy$$

Namely, the phase $arg\{Sm(0,0)\}$ of the MR data $Sm(0,0)$ at the center of the k-space is dominated by the phase shift $\theta m$ attributable to the body movement.

Accordingly, by obtaining the $\theta m$ from $arg\{Sm(0,0)\}$ and providing the opposite rotation $\theta m$ for MR data $Sm(kx,ky)$, it is possible to offset the phase shift $\theta m$ caused by the body movement.

According to the diffusion sensitizing imaging method and the MRI apparatus based on this invention, MR data is collected along spiral trajectories on the k-space, and it becomes possible to increase the number of times of sampling at one inducement and therefore reduce the number of times of inducement as compared with the conventional method and apparatus. Consequently, it becomes possible to shorten the image pickup time and therefore suppress motion artifacts. Moreover, the time occupancy and the burden imposed on the patient are reduced. Because of the isotropic distribution of positions of MR data on the k-space, the picture quality does not deteriorate.

Moreover, even in case there is some influence of body movement, it can be eliminated in terms of the phase shift of MR data.

What is claimed is:

1. A method for producing a diffusion sensitized image by use of a pulse sequence with an IVIM scheme applied thereto, comprising the steps of:

applying an RF pulse to a diagnostic portion and applying motion probing gradients for diffusion sensitization of an arbitrary gradient axis;

collecting MR data at a center of k-space for a section of an approximate echo center; and collecting MR data sequentially along spiral trajectories which extend in a spiral form from said center of said k-space to an end of said k-space for a section after said approximate echo center.

2. A method for producing a diffusion sensitized image by use of a pulse sequence with IVIM scheme applied thereto, comprising the steps of:

applying an RF pulse to a diagnostic portion and applying motion probing gradients for diffusion sensitization of an arbitrary gradient axis;

collecting MR data at a center of k-space for a section of an approximate echo center;

collecting MR data sequentially along spiral trajectories which extend in a spiral form from said center of said k-space to an end of said k-space for a section after said approximate echo center; and modifying a phase of said MR data based on a phase of said MR data at said center of said k-space.

3. The method of claim 2, wherein said modifying of said phase of said MR data is based on an average phase of said MR data about said center of said k-space.

4. An apparatus for producing a diffusion sensitizing image by use of a pulse sequence with an IVIM scheme applied thereto, comprising:

means for applying an RF pulse to a diagnostic portion and applying motion probing gradients for diffusion sensitization of an arbitrary gradient axis;

spiral scanning means for collecting MR data at a center of k-space for a section of an approximate echo center and for collecting MR data sequentially along spiral trajectories which extend in a spiral form from said center of said k-space to an end of said k-space for a section after said approximate echo center.

5. An apparatus for producing a diffusion sensitized image by use of a pulse sequence with an IVIM scheme applied thereto, comprising:

means for applying an RF pulse to a diagnostic portion and applying motion probing gradients for diffusion sensitization of an arbitrary gradient axis;

spiral scanning means for collecting MR data at a center of k-space for a section of an approximate echo center and for collecting MR data sequentially along spiral trajectories which extend in a spiral form from said center of said k-space to an end of said k-space for a section after said approximate echo center; and phase modification means for modifying a phase of said MR data based on a phase of said MR data at said center of said k-space.

6. The apparatus of claim 5, wherein said phase modification means comprises means for modifying a phase of said MR data based on an average phase of said MR data about said center of said k-space.

* * * * *